(12) United States Patent
Wu et al.

(10) Patent No.: US 10,962,889 B2
(45) Date of Patent: Mar. 30, 2021

(54) METHOD AND APPARATUS FOR HIGH THROUGHPUT PHOTOMASK CURING

(71) Applicant: Applied Materials, Inc., Santa Clara, CA (US)

(72) Inventors: Banqiu Wu, San Jose, CA (US); Eli Dagan, Sunnyvale, CA (US); Khalid Makhamreh, Los Gatos, CA (US); Bruce J. Fender, Kalispell, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/685,164

(22) Filed: Nov. 15, 2019

(65) Prior Publication Data
US 2020/0166834 A1    May 28, 2020

Related U.S. Application Data

(60) Provisional application No. 62/771,875, filed on Nov. 27, 2018.

(51) Int. Cl.
| | | |
|---|---|---|
| *G06F 7/20* | (2006.01) | |
| *G03F 1/66* | (2012.01) | |
| *G03F 7/20* | (2006.01) | |
| *G03F 1/22* | (2012.01) | |

(52) U.S. Cl.
CPC ............ *G03F 7/707* (2013.01); *G03F 1/66* (2013.01); *G03F 7/70741* (2013.01); *G03F 1/22* (2013.01); *G03F 7/70716* (2013.01)

(58) Field of Classification Search
None
See application file for complete search history.

(56) References Cited

U.S. PATENT DOCUMENTS

| | | | | |
|---|---|---|---|---|
| 4,711,438 | A | * | 12/1987 | Guarino ............... B25B 1/06 250/440.11 |
| 2003/0121604 | A1 | * | 7/2003 | Keil ................. B32B 37/182 156/286 |
| 2004/0027551 | A1 | * | 2/2004 | Barringer ............ G03F 7/707 355/75 |
| 2004/0045183 | A1 | * | 3/2004 | Watzinger ........... F26B 25/06 34/210 |
| 2012/0002187 | A1 | * | 1/2012 | Zordan ............... G03F 7/707 355/73 |
| 2012/0138230 | A1 | * | 6/2012 | Bluck ................. G21K 5/10 156/345.54 |
| 2018/0119285 | A1 | | 5/2018 | Kurita et al. |
| 2019/0258155 | A1 | | 8/2019 | Ko et al. |
| 2019/0302607 | A1 | | 10/2019 | Taguchi et al. |

* cited by examiner

*Primary Examiner* — Michelle M Iacoletti
(74) *Attorney, Agent, or Firm* — Patterson + Sheridan LLP

(57) ABSTRACT

Embodiments of the present disclosure generally relate to methods and apparatus for preparing a photomask for a lithography process. In one embodiment, a curing chamber is disclosed that includes an elevator adapted to receive a plurality of holder units. Each of the holder units comprise a holder, a clamp holding a photomask, one or more studs coupled to the photomask by an adhesive, and a spring coupled to each of the one or more studs.

20 Claims, 3 Drawing Sheets

METHOD AND APPARATUS FOR HIGH THROUGHPUT PHOTOMASK CURING

CROSS-REFERENCE TO RELATED APPLICATION:

This application claims benefit of U.S. Provisional Patent Application Ser. No. 62/771,875, filed Nov. 27, 2018, which is hereby incorporated by reference herein.

BACKGROUND

Field

Embodiments of the present disclosure generally relate to methods and apparatus utilized to cure an adhesive used in the manufacture of photomasks.

Description of the Related Art

In the manufacture of electronic devices on a substrate, substrates, such as a semiconductor substrate, are subjected to many patterning processes. The patterning processes are typically performed using a photomask that is protected by a pellicle.

One patterning process includes extreme ultraviolet (EUV) lithography where the photomask is typically protected by a pellicle. The pellicle is fixed to the photomask via a stud that is adhered via an adhesive material (e.g., glue or an epoxy) at two or more corners or sides of the photomask. Oftentimes one or more of these studs need to be replaced. When a new stud has to be attached to the photomask, the new stud is re-adhered to the photomask. However, curing of the adhesive is time-consuming which limits the availability of usable photomasks in the patterning process.

What is needed is a method and apparatus for curing an adhesive on multiple photomasks.

SUMMARY

Embodiments of the present disclosure generally relate to methods and apparatus for preparing a photomask for a lithography process. In one embodiment, a curing chamber is disclosed that includes an elevator adapted to receive a plurality of curing units. Each of the curing units comprise a holder, a clamp holding a photomask, one or more studs coupled to the photomask by an adhesive, and a spring biasing the photomask to the clamp.

In another embodiment, a method is disclosed that includes providing a plurality of photomasks, attaching a plurality of studs to each of the plurality of photomasks with an adhesive, attaching a spring to each of the one or more studs, clamping each of the photomasks to a holder, and transferring each of the holders to a chamber to cure the adhesive.

In another embodiment, a method is disclosed that includes providing a plurality of photomasks, attaching a plurality of studs to each of the photomasks with an adhesive, securing each of the photomasks to a respective holder using a clamp coupled to the holder, tensioning each of the photomasks on the holder; and transferring the holder to a chamber to cure the adhesive.

In another embodiment, a curing unit for photomask assembly is disclosed that includes a holder, a clamp holding a photomask, one or more studs coupled to the photomask by an adhesive, and a spring that tensions the photomask against the clamp.

In another embodiment, a curing chamber is disclosed that includes a conveyor adapted to receive a plurality of curing units. Each of the curing units comprise a holder, a clamp holding a photomask, one or more studs coupled to the photomask by an adhesive, and a spring that tensions the photomask against the clamp.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and apparatus for fixing one or more studs to a photomask that may be utilized in extreme ultraviolet (EUV) lithography processes.

Figure 1:
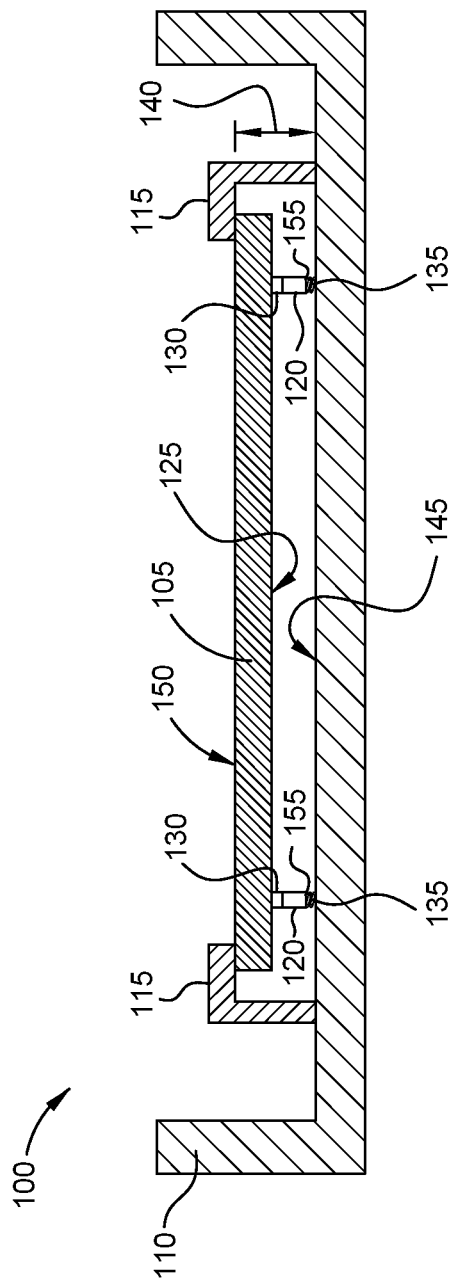
FIG. 1 is a schematic cross-sectional view of curing unit according to one embodiment.

FIG. 1 is a schematic cross-sectional view of a curing unit 100 according to one embodiment. The curing unit 100 includes a photomask 105 coupled to a holder 110 using one or more clamps 115. One or more studs 120 are shown coupled to a first surface 125 of the photomask 105. The studs 120 are fixed to the first surface 125 of the photomask 105 by an adhesive 130, which is an epoxy or glue.

The curing unit 100 shown in FIG. 1 shows the adhesive 130 in an uncured state. Pressure is applied to the studs 120 using a tensioning member 135 that is biased between each stud 120 and the holder 110. The tensioning member 135 is a spring, such as a spiral or coil spring (e.g., a compression spring) or other biasing member that exerts a force of about 5 psi against the stud 120 and the holder 110 and/or the one or more clamps 115. For example, the force of the tensioning members 135 is counteracted by the clamps 115 coupled between the holder 110 and the photomask 105.

The holder 110 is a metallic material such as aluminum or stainless steel. The holder is rectangular or square in plan view. Each of the studs 120 may be a solid rod or column, or a tubular member made of a metallic material such as aluminum or a titanium alloy. Each of the tensioning members 135 is a metallic material such as stainless steel. Each of the clamps 115 is a metallic material, such as stainless steel, in the form a "C" clamp or "L" clamp. The clamps 115 are fastened or fixed to the holder 110 such that a height 140 is maintained between a surface 145 of the holder 110 and an upper or second surface 150 of the photomask 105.

After the adhesive 130 is cured, the photomask is unclamped from the holder 110 with the studs 120 intact. The tensioning members 135 are removed from the studs 120 and a pellicle (not shown) is held mechanically to a lower surface 155 of the studs 120 at positions where the tensioning members 135 were located.

Figure 2:
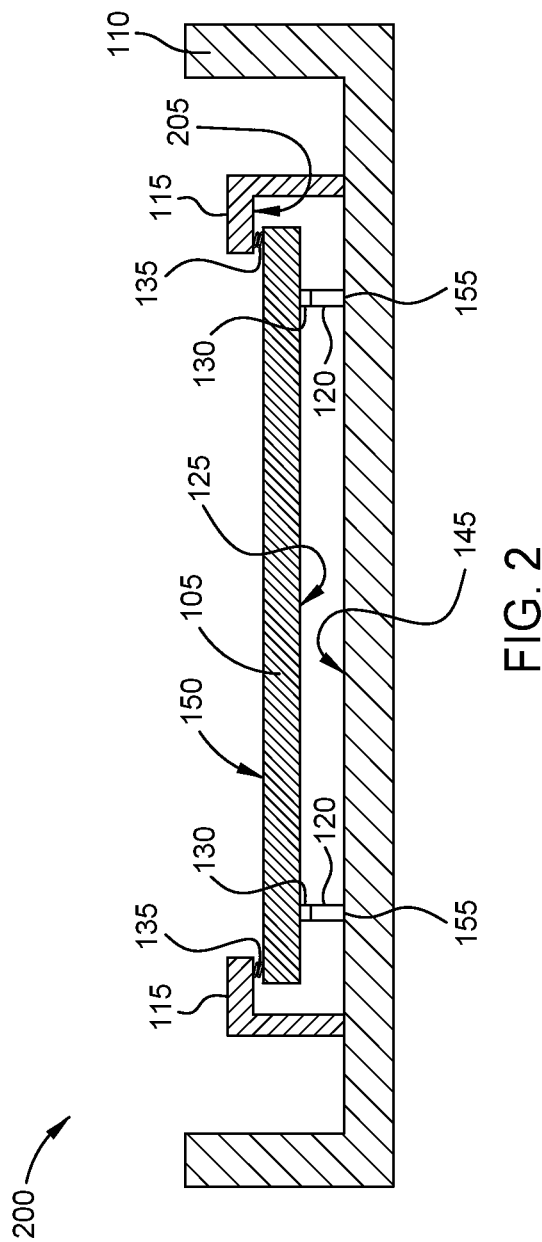
FIG. 2 is a schematic cross-sectional view of curing unit according to another embodiment.

FIG. 2 is a schematic cross-sectional view of a curing unit 200 according to another embodiment. The curing unit 200 is similar to the curing unit 100 of FIG. 1 with the exception of the location of the tensioning members 135. In this embodiment, the tensioning members 135 are positioned between a surface 205 of the clamps 115 and the second surface 150 of the photomask 105. The tensioning members 135 function the same as described in relation to the curing unit 100 of FIG. 1, and components sharing the same reference numerals will not be explained in detail for brevity. The positioning of the tensioning members 135 according to this embodiment makes the design more flexible due to the large surface area of second surface 150 relative to the surface area of studs 120.

Figure 3:
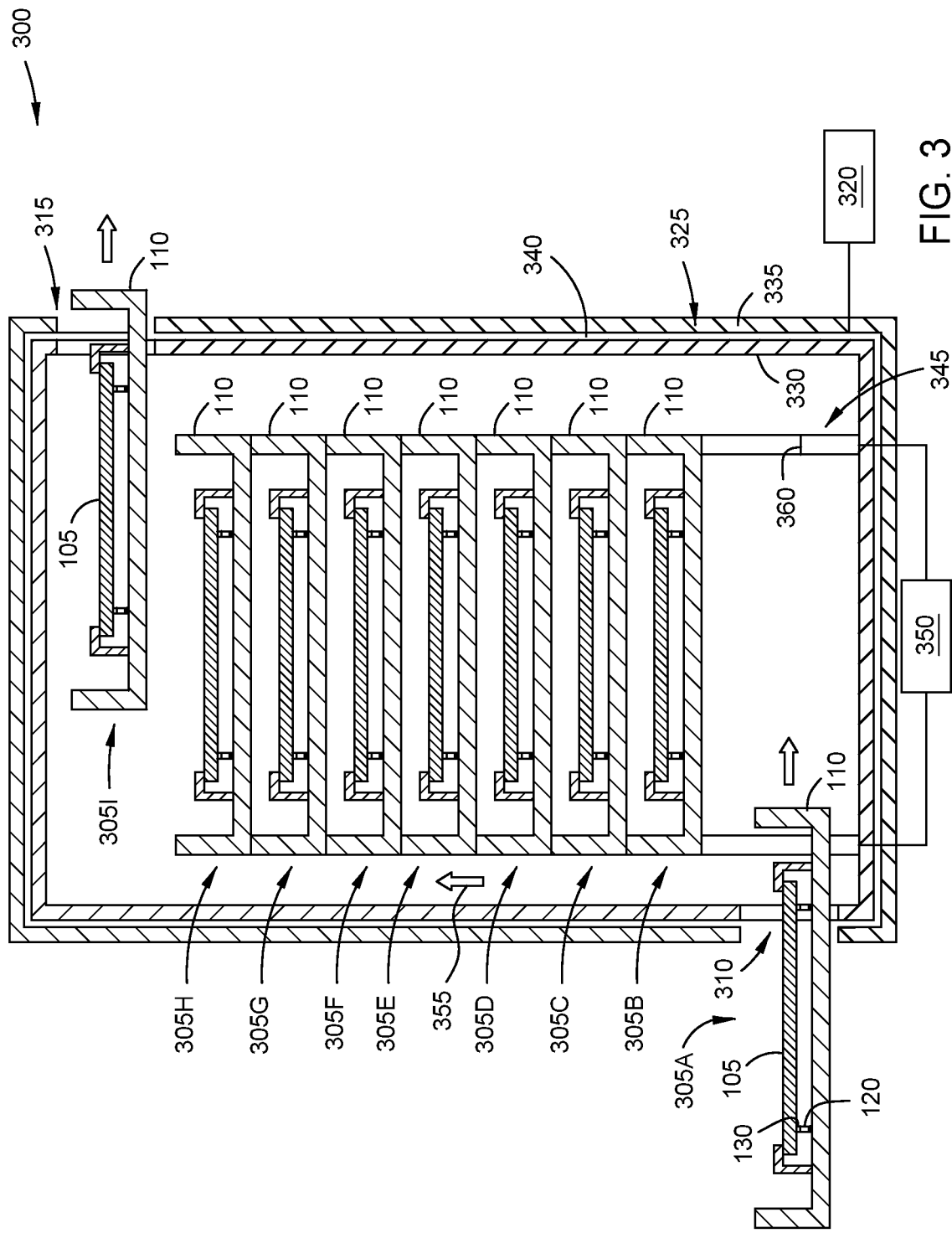
FIG. 3 is a schematic sectional view of one embodiment of a curing chamber having a plurality of curing units disposed therein.

FIG. 3 is a schematic sectional view of one embodiment of a curing chamber 300 that is utilized to cure the adhesive 130 between the studs 120 and the photomask 105. The curing chamber 300 is shown having a plurality of curing units 305A-305I disposed therein or adjacent thereto. Each of the curing units 305A-305I are one of the curing unit 100 or the curing unit 200 shown and described above, or other suitable photomask holder.

The curing chamber 300 includes an entry port 310 and an exit port 315 at opposing ends thereof. The entry port 310 receives the curing units 305A-305I each having a photomask 105, the studs 120, the tensioning members 135 and the adhesive 130 thereon.

The curing units 305A-305I are transferred into the curing chamber 300 and travel through the curing chamber 300 for a predetermined amount of time. The predetermined time is a residence time period sufficient to fully cure the adhesive. The residence time period is about 4 hours to about 5 hours. Each of the curing units 305A-305I pass through the curing chamber 300 from the entry port 310 to the exit port 315 in the residence time period. Once an individual curing unit reaches the volume of the curing chamber 300 near the exit port 315, the curing unit is removed from the curing chamber 300 where a pellicle is fixed to the studs 120. Doors (not shown) are utilized to cover the entry port 310 and the exit port 315 when no transfer is occurring.

The chamber includes a heating means 320 to maintain a constant temperature therein. The heating means 320 is a resistive heater or a heated fluid source coupled to a chamber body 325. The temperature may be about 80 degrees Celsius to about 120 degrees Celsius. Pressure in the curing chamber 300 is at or near atmospheric (ambient) pressure during the curing process.

In one embodiment, the chamber body 325 includes a double wall construction having a first or inner wall 330 surrounded by a second or outer wall 335. A heated liquid is flowed in a channel 340 to maintain the constant temperature therein. The channel 340 may be formed in one of the inner wall 330 or outer wall 335, or between the inner wall 330 and the outer wall 335.

The curing chamber 300 also includes a transit means 345, such as an elevator, a conveyor, or a carousel, that moves the curing units 305A-305I though the volume thereof. The transit means 345 is coupled to a motor or drive 350 that moves the transit means 345 having the curing units 305A-305I thereon in a direction indicated by the arrow referenced at 355. The transit means 345 may be an endless conveyor such that a plurality of support members 360 (each support member 360 adapted to support a curing unit thereon) disposed on the transit means 345 move (e.g., rotate) in the direction of arrow 355 (a first direction) from the entry port 310 to the exit port 315, and then return to the entry port 310 from the exit port 315 in a direction opposite to the direction of arrow 355 (a second direction). The speed of the transit means 345 may be chosen to coincide with the residence time period described above.

The curing chamber 300 as described herein effectively streamlines photomask assembly thus providing ample photomasks for lithography processes.

While the foregoing is directed to embodiments of the present disclosure, other and further embodiments of the disclosure may be devised without departing from the basic scope thereof.

What is claimed is:

1. A curing unit, comprising:
   a holder;
   a plurality of clamps coupled to the holder, each of the clamps configured to secure a photomask against the holder while a plurality of studs are coupled to the photomask by an adhesive; and
   a plurality of coil springs, each coil spring providing a force that tensions the photomask against the clamps.

2. The curing unit of claim 1, wherein the coil springs are located between the holder and each stud.

3. The curing unit of claim 1, wherein the coil springs are located between the plurality of clamps and the photomask.

4. A curing chamber, comprising:
   a chamber body;
   a conveyor disposed in the chamber body, the conveyor having a plurality of support members each adapted to receive one of a plurality of curing units and move the curing units vertically within the chamber body, wherein each of the curing units comprise:
   a holder;
   a clamp configured to secure a photomask against the holder while a plurality of studs are coupled to the photomask by an adhesive; and
   two or more coil springs configured to tension the photomask against the clamp.

5. The chamber of claim 4, wherein the chamber comprises a dual wall adapted to flow a heated fluid therein.

6. The chamber of claim 4, wherein the support members are adapted to move in a first vertical direction and a second vertical direction opposite to the first vertical direction.

7. The chamber of claim 4, wherein the coil springs are coupled to each of the two or more studs.

8. The chamber of claim 4, wherein the coil springs are located between the clamp and the photomask.

9. The chamber of claim 4, wherein the chamber includes an entry port and an exit port.

10. The chamber of claim 9, wherein a curing unit of the plurality of curing units enters the entry port having the adhesive thereon in an uncured state, and the curing unit exits the exit port with the adhesive thereon in a cured state.

11. A method, comprising:
    attaching a plurality of studs to each of a plurality photomasks with an adhesive;
    securing each of the photomasks to a respective holder using a clamp coupled to the holder on opposing sides of the respective photomask;
    tensioning each of the photomasks on the holder using a coil spring; and
    transferring the holder to a chamber to cure the adhesive.

12. The method of claim 11, wherein the coil spring comprises a plurality of coil springs and each coil spring is attached to each of the plurality of studs.

13. The method of claim 11, wherein the coil spring comprises a plurality of coil springs and each coil spring is attached between the clamp and each of the photomasks.

14. The method of claim 11, wherein the chamber comprises a conveyor that moves the holders in a first direction in the chamber.

15. The method of claim 14, wherein the chamber comprises an entry port and an exit port, and the first direction is between the entry port and the exit port.

16. The method of claim 11, further comprising heating the chamber.

17. The method of claim 16, wherein the heating comprises a resistive heater.

18. The method of claim 16, wherein the heating comprises a flowing a heated fluid in or through a body of the chamber.

19. The method of claim 11, wherein the chamber comprises a body having a double wall.

20. The method of claim 19, wherein a channel is formed in the body for flowing a heated fluid therein.

* * * * *